(12) United States Patent
Nishihata (10) Patent No.: US 8,149,594 B2
(45) Date of Patent: Apr. 3, 2012

(54) ELECTROMAGNETIC SHIELD STRUCTURE OF ELECTRONICS HOUSING

(75) Inventor: Yosuke Nishihata, Osaka (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 0 days.

(21) Appl. No.: 12/704,958

(22) Filed: Feb. 12, 2010

(65) Prior Publication Data

US 2010/0208447 A1 Aug. 19, 2010

(30) Foreign Application Priority Data

Feb. 19, 2009 (JP) ................................. 2009-036916

(51) Int. Cl.
*H05K 9/00* (2006.01)
(52) U.S. Cl. ........ 361/818; 361/752; 361/800; 361/816; 174/51; 174/250; 174/377; 174/520; 439/76.1; 439/92; 439/95; 439/181; 439/188; 439/271; 439/320; 439/357; 439/497; 439/532; 439/567; 439/564; 439/607.1; 439/638; 455/301
(58) Field of Classification Search .................. 361/818, 361/752, 800, 816; 174/51, 250, 377, 520; 439/95, 357, 564, 638, 76.1, 92, 181, 188, 439/271, 320, 497, 532, 567, 607.1; 455/301
See application file for complete search history.

(56) References Cited

U.S. PATENT DOCUMENTS

| | | | | |
|---|---|---|---|---|
| 4,518,209 A | * | 5/1985 | Negley | 439/92 |
| 4,822,293 A | * | 4/1989 | Robson | 439/271 |
| 5,309,092 A | * | 5/1994 | Kuntz et al. | 324/158.1 |
| 5,340,333 A | * | 8/1994 | Schroth | 439/607.25 |
| 5,464,057 A | * | 11/1995 | Albano et al. | 165/173 |
| 5,510,959 A | * | 4/1996 | Derstine et al. | 361/816 |
| 5,563,450 A | * | 10/1996 | Bader et al. | 257/785 |
| 5,572,408 A | * | 11/1996 | Anhalt et al. | 361/737 |
| 5,865,645 A | * | 2/1999 | Embo et al. | 439/567 |
| 6,174,182 B1 | * | 1/2001 | Kuo | 439/181 |
| 6,186,825 B1 | * | 2/2001 | Bogiel et al. | 439/532 |

(Continued)

FOREIGN PATENT DOCUMENTS

CN 1574671 A 2/2005

(Continued)

OTHER PUBLICATIONS

Chinese Office Action dated May 30, 2011, issued in corresponding Chinese Patent Application No. 201010004676.X.

*Primary Examiner* — Xiaoliang Chen
(74) *Attorney, Agent, or Firm* — Westerman, Hattori, Daniels & Adrian, LLP (57) ABSTRACT

An electromagnetic shield structure of an electronics housing includes a terminal having a protrusion for external connection; a substrate having the terminal disposed thereon and electrically connected to the terminal; a housing made of resin, enclosing the substrate and having an opening at a position corresponding to the protrusion of the terminal on a front surface side where the protrusion of the terminal is located; and an electromagnetic shield disposed so as to surround the substrate inside the housing, having an opening at the position corresponding to the protrusion of the terminal, and electromagnetically shielding the substrate. The electromagnetic shield has a bent portion formed on the front surface side for filling a gap between the terminal and the housing.

7 Claims, 6 Drawing Sheets

U.S. PATENT DOCUMENTS

| | | | |
|---|---|---|---|
| 6,241,556 B1* | 6/2001 | Chih | 439/607.01 |
| 6,339,536 B1* | 1/2002 | Buican et al. | 361/818 |
| 6,593,673 B1* | 7/2003 | Sugai et al. | 307/116 |
| 6,685,501 B1* | 2/2004 | Wu et al. | 439/497 |
| 6,720,904 B1* | 4/2004 | Darbee | 341/175 |
| 6,976,876 B1* | 12/2005 | Su et al. | 439/607.57 |
| 6,979,774 B2* | 12/2005 | Abe et al. | 174/377 |
| 7,044,782 B2* | 5/2006 | Enami et al. | 439/564 |
| 7,155,975 B2* | 1/2007 | Mitani et al. | 73/504.03 |
| 7,175,455 B2* | 2/2007 | Khemakhem et al. | 439/188 |
| 7,210,947 B1* | 5/2007 | Fodero et al. | 439/95 |
| 7,333,328 B2* | 2/2008 | Funawatari et al. | 361/679.33 |
| 7,768,798 B2* | 8/2010 | Aono et al. | 361/818 |
| 2002/0122300 A1* | 9/2002 | Nakamura et al. | 361/724 |
| 2003/0223200 A1* | 12/2003 | Simmons et al. | 361/737 |
| 2004/0141253 A1* | 7/2004 | Funawatari et al. | 360/97.01 |
| 2004/0181358 A1* | 9/2004 | Youngquist | 702/132 |
| 2004/0248436 A1 | 12/2004 | Abe et al. | |
| 2005/0003685 A1* | 1/2005 | Abe et al. | 439/76.1 |
| 2005/0014410 A1* | 1/2005 | Justice | 439/320 |
| 2006/0246866 A1* | 11/2006 | Nakagawa et al. | 455/301 |
| 2007/0064437 A1* | 3/2007 | Blumel et al. | 362/514 |
| 2010/0151707 A1* | 6/2010 | AbuGhazaleh et al. | 439/76.1 |

FOREIGN PATENT DOCUMENTS

| | | |
|---|---|---|
| JP | 2002-176282 A | 6/2002 |
| JP | 2005-085831 A | 3/2005 |

* cited by examiner

ELECTROMAGNETIC SHIELD STRUCTURE OF ELECTRONICS HOUSING

BACKGROUND OF THE INVENTION

1. Field of the Invention

The present invention relates to an electromagnetic shield structure of an electronics housing for blocking an electromagnetic wave between the electronics and the outside thereof.

2. Description of the Background Art

The electronics having a connection terminal connected to the outside is generally disposed within a housing because exposure of the electronics to the outside during use leads to a decrease in durability and operability. Furthermore, the electronics are surrounded by an electromagnetic shield such that the electronics are electromagnetically shielded from the outside.

There may be a case where the electromagnetic shield is provided with a function as an electromagnetic shield by forming a thin film having conductivity and electromagnetic-wave shielding properties on the inner surface of the housing, providing a protrusion having a shape of a flat spring on the periphery of a connection terminal, and bringing the protrusion into contact with the inner surface of the housing for achieving conduction. In recent years, however, the electromagnetic shield may often be made of a plate-shaped metal member subjected to bending and provided separately from the housing, in consideration of the environmental load of the plating process when forming a conductive thin film on the inner surface of the housing.

The electronics housing equipped with a connection terminal has conventionally been integrally molded in the shape of a box with resin and the like. Japanese Patent Laying-Open No. 2005-85831 is one of the prior art documents disclosing such an electronics housing. The electronics housing disclosed in this document includes a housing body through which a connection terminal connected to the outside is exposed, and a cover member attached to the housing body and covering the connection terminal. The electronics housing also has a stepped portion inwardly concaved so as to surround the connection terminal, and an engagement portion formed on the surface provided with a leg of the housing body and on the surface of the stepped portion approximately parallel to the surface provided with the leg. When the cover member is attached, it engages with the engagement portion.

The stepped portion inwardly concaved so as to surround the above-described connection terminal serves to fill the gap between the protrusion of the connection terminal and the outer surface of the housing. The presence of the gap may result in adherence of dust and the like to the electronics, and also may impair the appearance.

Furthermore, there may also be a case where a baby's finger or the like is accidentally inserted into the gap. Thus, the gap should be filled without fail.

The electronics housing consists of a plurality of components. According to the electronics housing disclosed in the above-described document, the stepped portion inwardly concaved so as to surround the connection terminal is formed in a rear case. The components constituting the housing are often manufactured by injection molding of resin material, in which case a mold for injection molding is required for manufacturing the housing.

Generally, a core mold, a cavity mold and a slide mold are required for manufacturing the component such as a rear case accommodating the connection terminal. In this case, the core mold is a male mold, the cavity mold is a female mold, and the slide mold is a mold which is movably placed in the portion between the core mold and the cavity mold into which resin is injected. The outer contour of the rear case including a shape of a concave portion is determined by the core mold and the cavity mold. The position or the shape of the opening accommodating the protrusion of the connection terminal is determined by the slide mold.

Since there are various types and sizes of connection terminals, the rear case should be manufactured to have a shape accommodating the connection terminal. Specifically, a change in shape of the protrusion of the connection terminal creates a need to reflect the change of the shape in the slide mold. Also, a change in the shape of the gap between the housing and the connection terminal creates a need to reflect the shape complementing the gap in the core mold and the cavity mold. Accordingly, there is a need to manufacture each of a core mold, a cavity mold and a slide mold used for producing a rear case, so as to accommodate the shape of the connection terminal.

According to the electronics housing disclosed in the above-described document, all of the core mold, the cavity mold and the slide mold for the housing components accommodating the connection terminal should be newly manufactured in accordance with a change in the type of the connection terminal to be attached. Thus, even a slight change in the shape of the connection terminal requires at least three molds to be produced accordingly, which results in an increase in cost for the electronics housing.

SUMMARY OF THE INVENTION

An object of the present invention is to provide an electromagnetic shield structure of an electronics housing by which, even in the case where there is a change in the type of the connection terminal to be attached, cost reduction can be achieved by minimizing the replacement of the mold used for manufacturing a housing component so as to accommodate the connection terminal.

An electromagnetic shield structure of an electronics housing according to the present invention includes a terminal, a substrate, a housing, and an electromagnetic shield. The terminal has a protrusion for external connection. The substrate has the terminal disposed thereon and is electrically connected to the terminal. The housing is made of resin, encloses the substrate and has an opening at a position corresponding to the protrusion of the terminal on a front surface side where the protrusion of the terminal is located. The electromagnetic shield is disposed so as to surround the substrate inside the housing, has an opening at the position corresponding to the protrusion of the terminal and electromagnetically shields the substrate. The electromagnetic shield has a bent portion formed on the front surface side for filling a gap between the terminal and the housing.

According to the configuration as described above, the structure for filling the gap between the connection terminal and the housing, which is conventionally provided in the electronics housing made of resin, can be replaced with an electromagnetic shield made of a plate-shaped metal material. Consequently, even when a different type of the connection terminal to be attached is used, it becomes unnecessary to form, on the inner surface of the housing, a structure having a shape filling the gap between the connection terminal and the housing. This eliminates the need to replace the core mold and the cavity mold among the molds used when the housing components accommodating the connection terminal are manufactured. Accordingly, only the slide mold needs to be replaced with a different type of the slide mold in accordance with a change in the shape of the opening associated with a change of the connection terminal, which allows a reduction in cost for the electronics housing.

In the electromagnetic shield structure of the electronics housing according to the present invention, the electromagnetic shield may include a first shield member disposed below the substrate, a second shield member disposed above the substrate, and a third shield member having the opening and disposed at a position of the substrate where the terminal is connected. Furthermore, the third shield member may have a bent portion formed on a peripheral region around the opening. According to the configuration as described above, the electromagnetic shield is divided into at least three components surrounding the substrate, which facilitates installation of the electromagnetic shield.

In the electromagnetic shield structure of the electronics housing according to the present invention, the electromagnetic shield may include a first shield member disposed below the substrate, a second shield member disposed above the substrate, and a third shield member having the opening and disposed at a position of the substrate where the terminal is connected. Furthermore, the first shield member may have the bent portion formed to face a lower surface of the protrusion of the terminal, the second shield member may have the bent portion formed to face an upper surface of the protrusion of the terminal, and the third shield member may have each bent portion formed to face a corresponding one of side surfaces of the protrusion of the terminal.

According to the configuration as described above, the electromagnetic shield is divided into at least three components surrounding the substrate, which facilitates installation of the electromagnetic shield. Furthermore, the bent portions are provided in their respective electromagnetic shield members, which can prevent the bending process from being complicated during manufacturing of the electromagnetic shield member.

In the electromagnetic shield structure of the electronics housing according to the present invention, an inner edge of the opening of the third shield member and an outer periphery of the protrusion of the terminal are pressed against each other to bias the third shield member toward a front surface side of the electromagnetic shield, so as to bring the first shield member and the second shield member into close contact with the third shield member. The configuration as described above allows conduction between the electromagnetic shield members, with the result that a function as an electromagnetic shield can be more effectively performed.

In the electromagnetic shield structure of the electronics housing according to the present invention, the outer periphery of the protrusion of the terminal may be formed in a tapered shape. In the configuration as described above, when the electromagnetic shield is installed, the inner edge of the opening of the third shield member and the tapered outer periphery of the protrusion of the connection terminal are pressed against each other. This causes the third shield member to be biased toward the tip of the protrusion, such that the third shield member is brought into close contact with the first shield member and the second shield member. This allows conduction between the electromagnetic shield members, with the result that a function as an electromagnetic shield can be more effectively performed.

In the electromagnetic shield structure of the electronics housing according to the present invention, a curved portion may be formed at a basal portion of the protrusion of the terminal. In the configuration as described above, when the electromagnetic shield is installed, the inner edge of the opening of the third shield member and the curved portion formed at the basal portion of the protrusion of the connection terminal are pressed against each other. This causes the third shield member to be biased toward the tip of the protrusion, such that the third shield member is brought into close contact with the first shield member and the second shield member. This allows conduction between the electromagnetic shield members, with the result that a function as an electromagnetic shield can be more effectively performed.

According to the present invention, the structure for filling a gap between the connection terminal and the housing is formed in the electromagnetic shield, which eliminates the need to form a structure for filling this gap in the housing made of resin. Therefore, even when a different type of the connection terminal attached to the electronics housing is employed, the structure filling the gap can be achieved by changing the shape of the electromagnetic shield.

Consequently, even when a different type of the connection terminal to be attached is used, the replacement of the mold used for manufacturing housing components so as to accommodate the connection terminal is minimized, which allows reduction in cost required to accommodate the electronics housing to a newly manufactured connection terminal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An electromagnetic shield structure of an electronics housing in the embodiment according to the present invention will be hereinafter described with reference to the drawings.

First Embodiment

Figure 1:
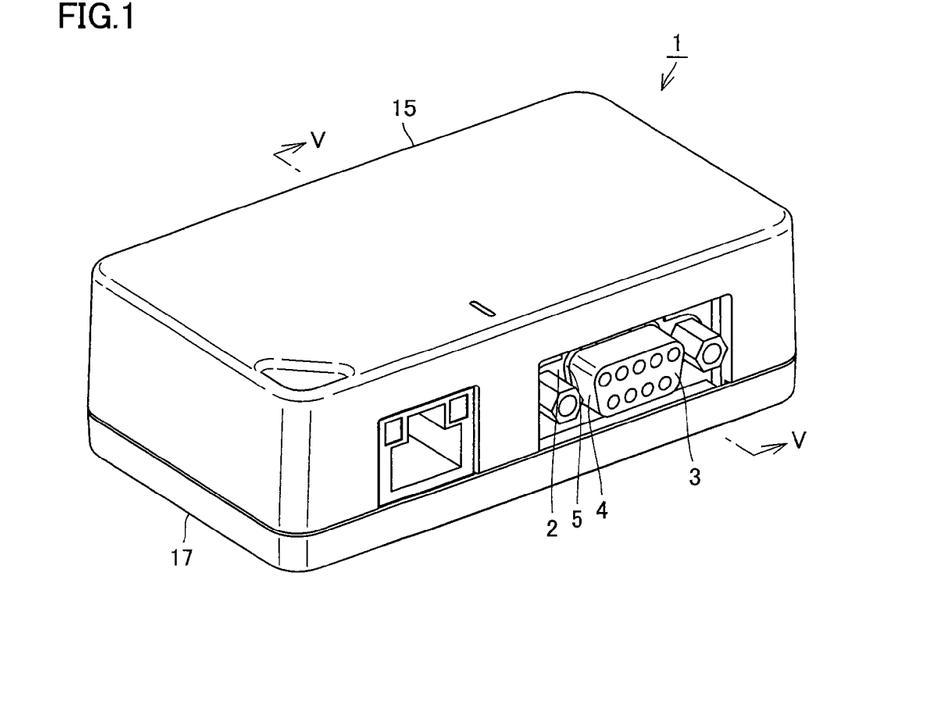
FIG. 1 is a perspective view of an outer appearance of an electronics housing according to the first embodiment of the present invention.
Figure 2:
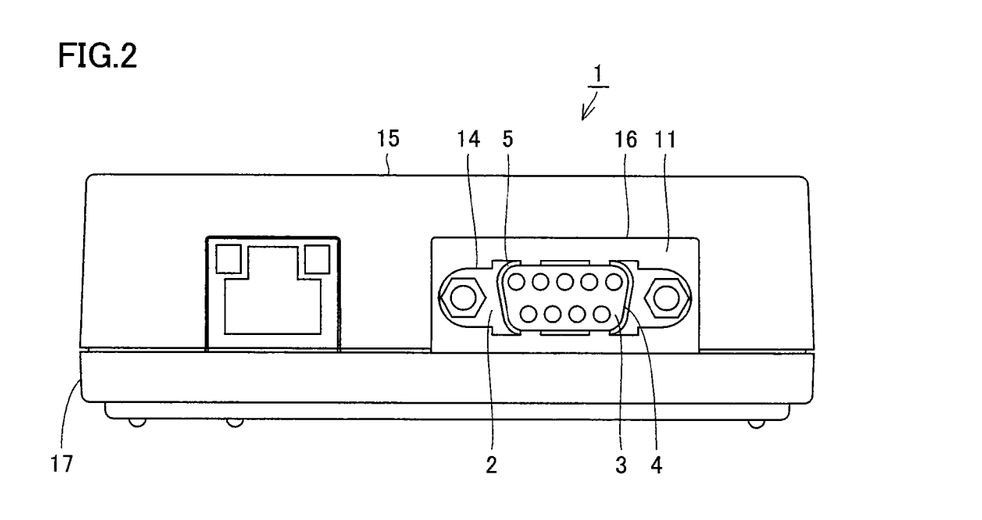
FIG. 2 is a side view of the outer appearance of the electronics housing according to the present embodiment.
Figure 3:
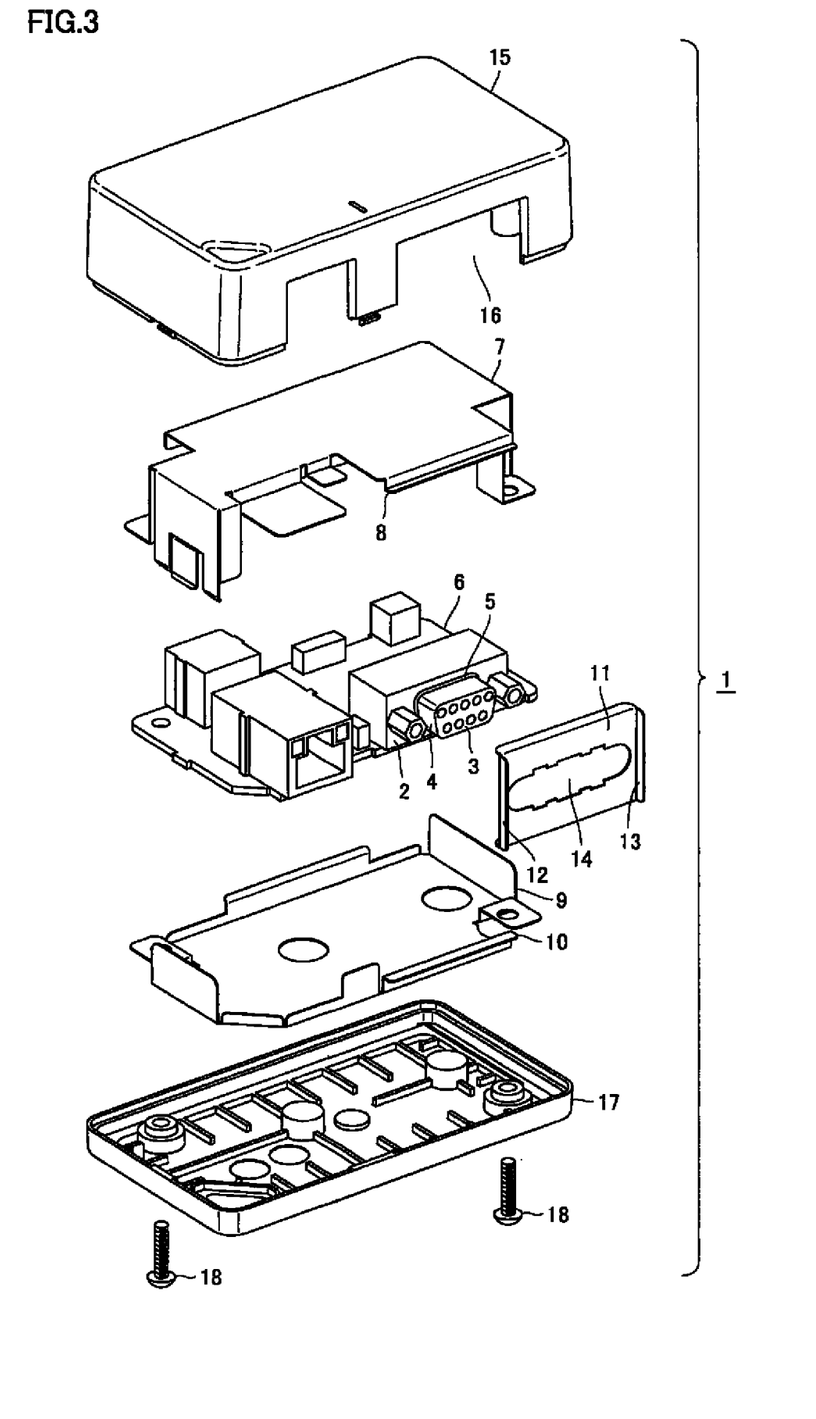
FIG. 3 is an exploded perspective view of components of the electronics housing according to the present embodiment.

FIG. 1 is a perspective view of the outer appearance of an electronics housing according to the first embodiment of the present invention. FIG. 2 is a side view of the outer appearance of the electronics housing according to the present embodiment. FIG. 3 is an exploded perspective view of components of the electronics housing according to the present embodiment.

As shown in FIGS. 1 and 2, an electronics housing 1 according to the first embodiment of the present invention is formed as a housing having an exterior made of resin. The resin material may include thermosetting resin such as polycarbonate or polyacetal, or thermoplastic resin such as acrylonitrile-butadiene-styrene resin. Electronics housing 1 is equipped with a terminal 2 having a protrusion 3 for external connection. The housing includes an upper housing 15 and a lower housing 17. Upper housing 15 is provided on its front surface with an opening 16 that is formed at the position corresponding to protrusion 3 of terminal 2.

As shown in FIG. 3, within the electronics housing according to the present embodiment, terminal 2 having protrusion 3 for external connection is placed on substrate 6 and a substrate 6 electrically connected to terminal 2 is disposed. The electromagnetic shield for electromagnetically shielding substrate 6 from the outside is disposed so as to surround substrate 6. When the electronics housing is used, the electromagnetic shield and the cable connected to substrate 6 are rendered conductive to establish a ground.

The electromagnetic shield is formed of plate-shaped metal material and, for example, may be formed using an electrolytic tin-plated steel plate (SPTE) as material. It is also preferable that the electromagnetic shield is formed of the material having excellent press-formability and also having a predetermined hardness so as not to cause plastic deformation when it is installed around the substrate.

The electromagnetic shield includes a first shield member 9 disposed below substrate 6, a second shield member 7 disposed above substrate 6, and a third shield member 11 disposed at the position of substrate 6 where terminal 2 is connected and having an opening 14 accommodating protrusion 3 of terminal 2. Although the configuration having the electromagnetic shield consisting of three members is described in the present embodiment, the number of the members is not limited thereto.

First shield member 9 has a bent portion 10 formed therein which faces the lower surface of protrusion 3 of terminal 2. Second shield member 7 has a bent portion 8 formed therein which faces the upper surface of protrusion 3 of terminal 2. Third shield member 11 has bent portions 12 and 13 formed therein which face the side surfaces, respectively, of protrusion 3 of terminal 2. In this way, each bent portion is merely provided on a corresponding one of the shield members to provide a configuration in which the shield member has a simple structured bent portion added on its edge portion. This configuration prevents increase in complexity in the bending process during manufacturing of the shield member.

First shield member 9, second shield member 7 and third shield member 11 are assembled with one another to form a box-shaped electromagnetic shield. A housing is disposed so as to surround the outside of the electromagnetic shield. The housing includes upper housing 15 disposed above the electromagnetic shield and having opening 16 formed at the position corresponding to protrusion 3 of terminal 2, and lower housing 17 disposed below the electromagnetic shield. Lower housing 17 is provided with a through hole for securing the installed electronics housing 1 by a screw 18.

Figure 4:
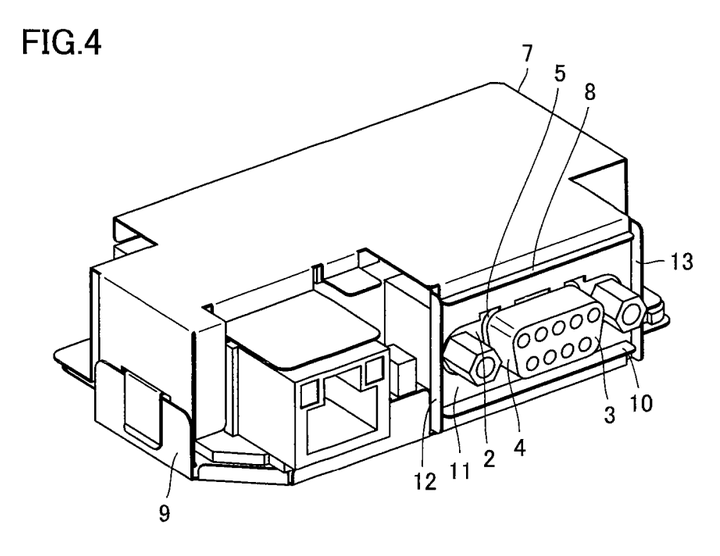
FIG. 4 is a perspective view showing the state where a substrate having a terminal connected thereto is surrounded by an electromagnetic shield.

FIG. 4 is a perspective view showing the state where the substrate having a terminal connected thereto is surrounded by the electromagnetic shield. As shown in FIG. 4, when first shield member 9, second shield member 7 and third shield member 11 are assembled to form an electromagnetic shield, bent portion 10 of first shield member 9 and bent portion 8 of second shield member 7 are arranged so as to face each other. Bent portions 10 and 8 are positioned between bent portions 12 and 13 of third shield member 11. Consequently, four bent portions bent toward the front surface side of the housing are arranged on the front surface of the electromagnetic shield so as to surround protrusion 3 of terminal 2.

Although the present embodiment has been described illustrating the configuration in which the bent portion formed in the electromagnetic shield as described above is bent toward the front surface side of the housing so as to surround the protrusion of the terminal, the electromagnetic shield structure according to the present invention is not limited to this configuration. The bent portion formed in the electromagnetic shield can be optionally changed in position, shape or the like, as long as it may fill the gap between the terminal and the housing.

Figure 5:
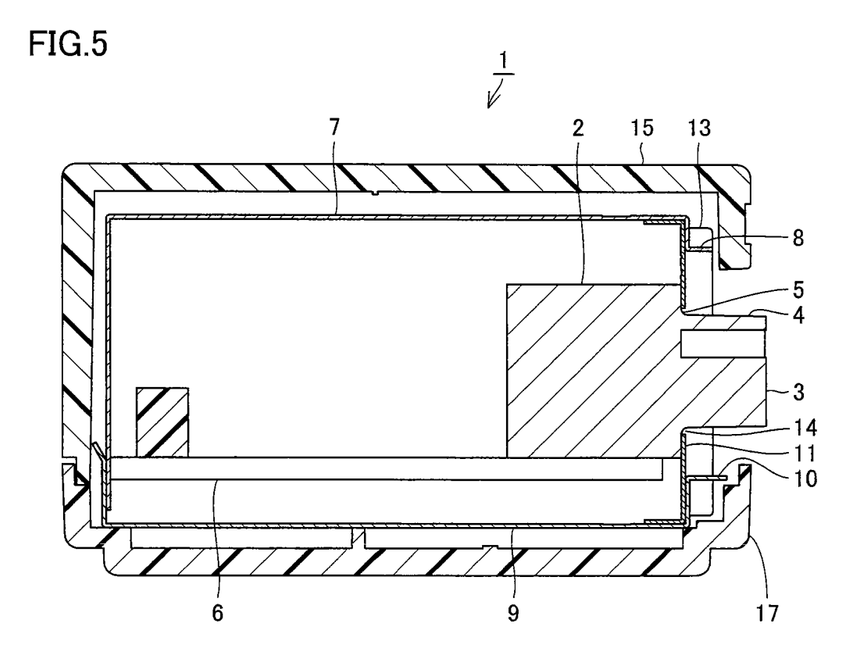
FIG. 5 is a cross sectional view of a structure of the electronics housing according to the present embodiment as seen in the direction of an arrow line V-V in FIG. 1.

A method for assembling an electronics housing according to the present embodiment will be hereinafter described. FIG. 5 is a cross sectional view of the structure of the electronics housing according to the present embodiment as seen in the direction of an arrow line V-V in FIG. 1. First prepared is substrate 6 having an upper surface on which terminal 2 provided with protrusion 3 for external connection is connected. Protrusion 3 of terminal 2 is inserted through opening 14 of third shield member 11, and third shield member 11 is disposed at a basal portion 5 of protrusion 3.

Then, substrate 6 on which third shield member 11 is disposed is placed on the upper surface of first shield member 9. First shield member 9 has a bent portion formed on its edge, which is bent toward the upper surface side so as to conform to the shape of substrate 6. Substrate 6 is disposed on the inside of this bent portion. Third shield member 11 has a bent portion formed on each of its upper and lower edges, which is bent approximately at a right angle toward the back surface side of the housing. First shield member 9 and third shield member 11 are assembled such that the lower part in the front surface of third shield member 11 is brought into contact with the inner surface of the above-described bent portion of first shield member 9.

Second shield member 7 has a bent portion formed on its edge, which is bent downward so as to conform to the shape of the bent portion of first shield member 9. The second shield member is installed such that the bent portion of second shield member 7 and the bent portion of first shield member 9 are fixed to each other and the upper part in the front surface of third shield member 11 and the inner surface of the bent portion of second shield member 7 are brought into contact with each other.

FIG. 4 shows the above-described structure in which substrate 6 is surrounded by the electromagnetic shields. This structure is disposed on the upper surface of lower housing 17, on which upper housing 15 is installed such that it engages with lower housing 17. In this way, the housing enclosing substrate 6 is assembled.

Figure 6:
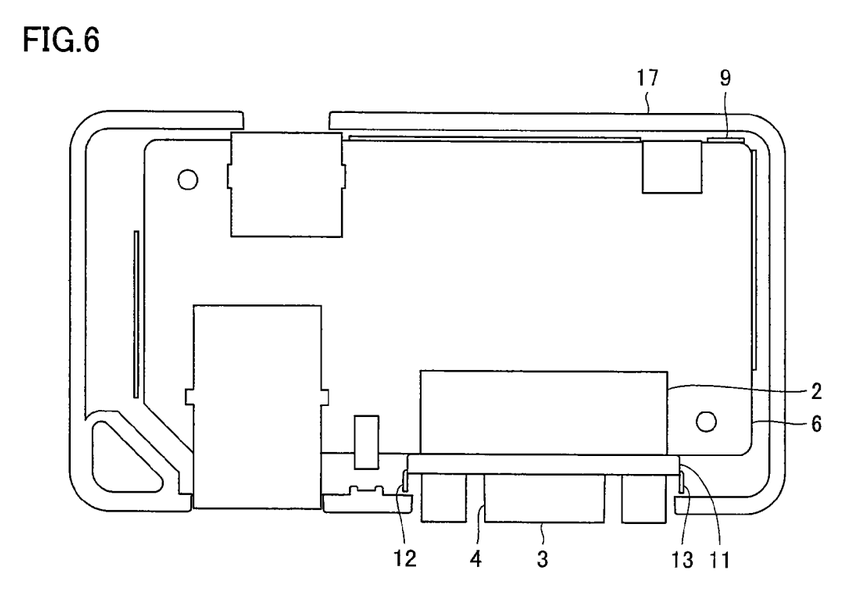
FIG. 6 is a plan view showing the state where a substrate having the first and third shield members installed thereon is disposed on the upper surface of a lower housing.

FIG. 6 is a plan view showing the state where a substrate having the first and third shield members installed thereon is disposed on the upper surface of the lower housing. As shown in FIG. 6, bent portions 12 and 13 of third shield member 11 serve to fill a gap between terminal 2 and the housing.

As described above, in the electromagnetic shield structure of the electronics housing according to the present embodiment, a bent portion for filling a gap between terminal 2 and the housing is formed in the electromagnetic shield. This eliminates the need to form a structure in upper housing 15 and lower housing 17 for filling the gap between terminal 2 and the housing. Accordingly, among the molds used when upper housing 15 and lower housing 17 are manufactured by injection molding, only the slide mold used for forming opening 16 in upper housing 15 needs to be replaced with a different type of the slide mold in accordance with the type of terminal 2. In other words, upper housing 15 and lower housing 17 can be manufactured by using common core and cavity molds, irrespective of the type of the terminal.

In addition, the electromagnetic shield having an additional bent portion is formed by pressing a plate-shaped metal material, which results in only a slight increase in cost even by addition of the bent portion. From the viewpoint of the overall manufacturing costs of the electronics housing, the electromagnetic shield structure of the electronics housing according to the present embodiment is applied to thereby allow cost reduction. Furthermore, as the electromagnetic shield is divided into a plurality of shield members, the electromagnetic shield can readily be installed so as to surround the substrate while aligning the opening of the electromagnetic shield with the position of the terminal on the substrate.

Second Embodiment

Figure 7:
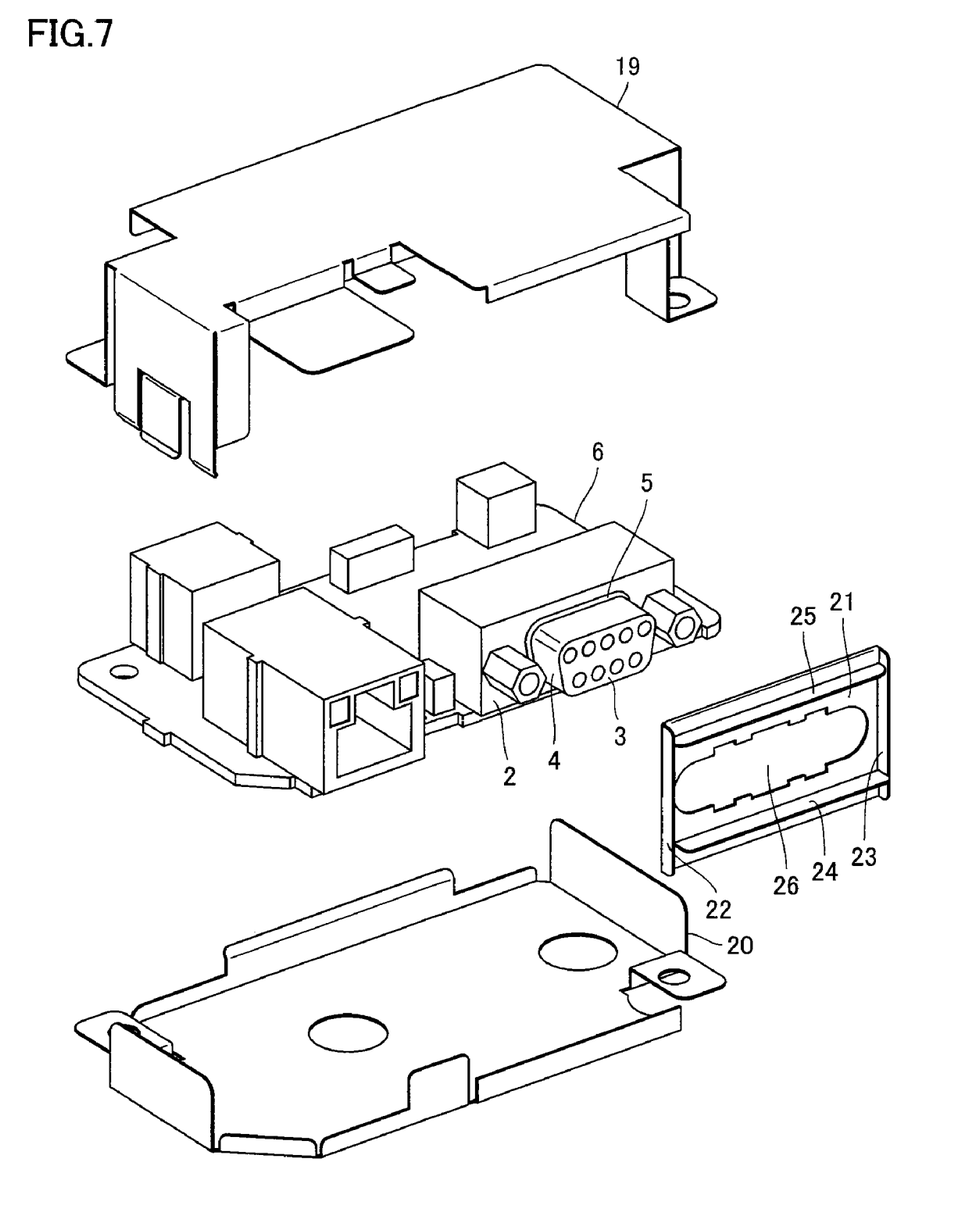
FIG. 7 is an exploded perspective view of an electromagnetic shield structure of the electronics housing according to the second embodiment of the present invention.
Figure 8:
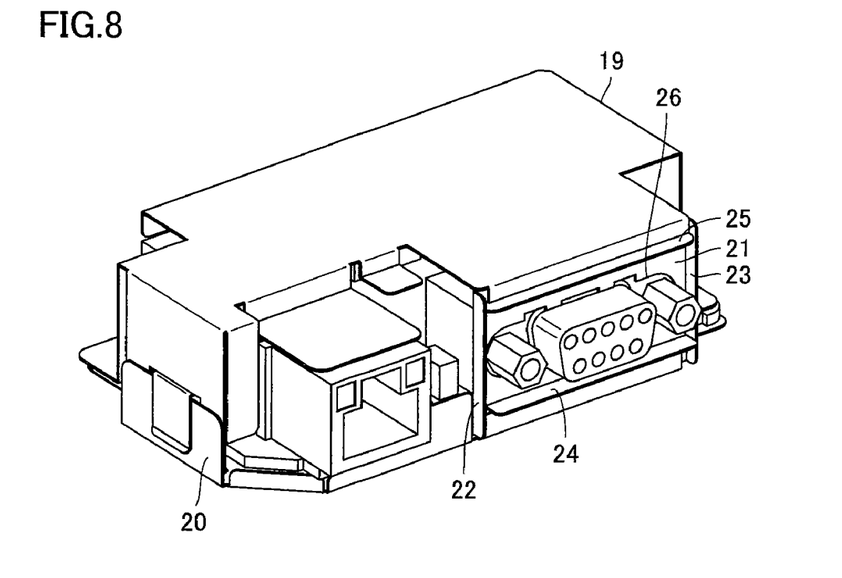
FIG. 8 is a perspective view showing the state where the substrate having the terminal connected thereto is surrounded by the electromagnetic shield.

FIG. 7 is an exploded perspective view of the electromagnetic shield structure of the electronics housing according to the second embodiment of the present invention. FIG. 8 is a perspective view showing the state where the substrate having the terminal connected thereto is surrounded by the electromagnetic shield. As shown in FIG. 7, the electromagnetic shield according to the second embodiment of the present invention includes a first shield member 20 disposed below substrate 6, a second shield member 19 disposed above substrate 6, and a third shield member 21 disposed at the position of substrate 6 where terminal 2 is connected and having an opening 26 accommodating protrusion 3 of terminal 2. Although the present embodiment shows the case where the electromagnetic shield consists of three members, the number of the members is not limited thereto.

On the peripheral region around opening 26 of third shield member 21, bent portions 22 and 23 facing the side surfaces, respectively, of protrusion 3 of terminal 2 are formed. Furthermore, a bent portion 25 facing the upper surface of protrusion 3 of terminal 2 and a bent portion 24 facing the lower surface thereof are also formed. Thus, since the bent portions surrounding protrusion 3 of terminal 2 are formed in third shield member 21, no bent portion for surrounding protrusion 3 of terminal 2 is formed in first shield member 20 and second shield member 19.

As shown in FIG. 8, first shield member 20, second shield member 19 and third shield member 21 are assembled with one another so as to surround substrate 6, to thereby form a box-shaped electromagnetic shield. It is to be noted that since the shapes other than those of the bent portions surrounding protrusion 3 of terminal 2 are the same as those in the first embodiment, the description thereof will not be repeated.

Figure 9:
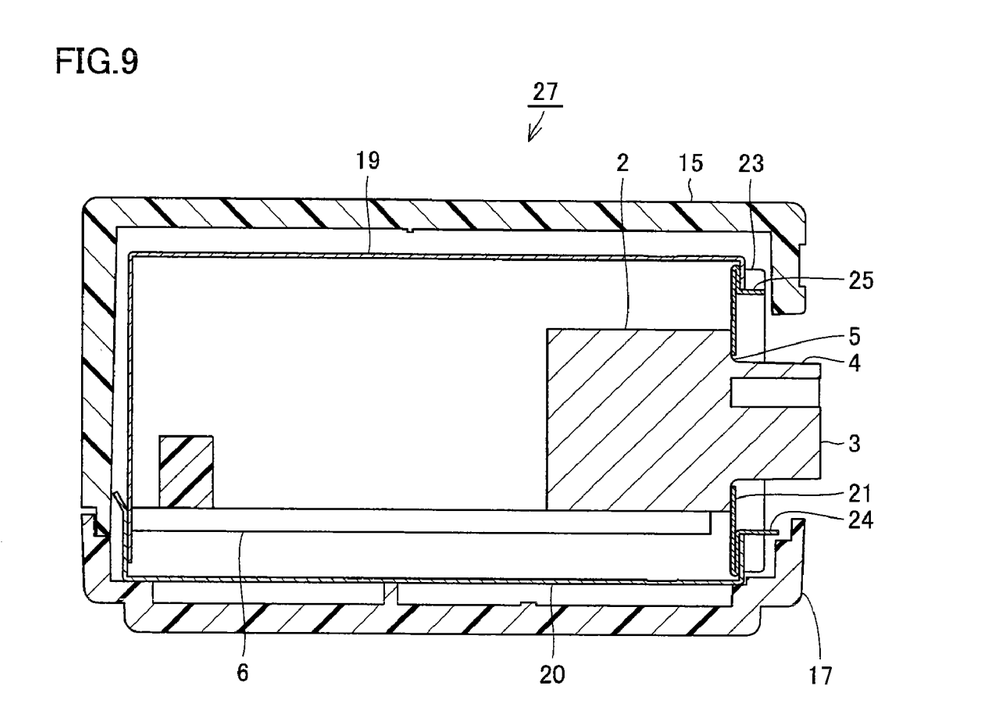
FIG. 9 is a cross sectional view of the electromagnetic shield structure of the electronics housing according to the present embodiment.

FIG. 9 is a cross sectional view of the electromagnetic shield structure of the electronics housing according to the present embodiment. As shown in FIG. 9, in the electromagnetic shield structure according to the present embodiment, all of the bent portions surrounding protrusion 3 of terminal 2 are formed in third shield member 21. Bent portion 25 in the upper part of third shield member 21 and bent portion 24 in the lower part thereof are bent to have a folded portion, so as to be bent toward the front surface side of the housing. The method for assembling first shield member 20, second shield member 19 and third shield member 21 is the same as that described in the first embodiment.

As described above, in the electromagnetic shield structure of the electronics housing according to the present embodiment, a bent portion for filling a gap between terminal 2 and the housing is formed in the electromagnetic shield. This eliminates the need to form a structure in upper housing 15 and lower housing 17 for filling the gap between terminal 2 and the housing. Accordingly, among the molds used when upper housing 15 and lower housing 17 are manufactured by injection molding, only the slide mold used for forming opening 16 in upper housing 15 needs to be replaced with a different type of the slide mold in accordance with the type of terminal 2. In other words, upper housing 15 and lower housing 17 can be manufactured by using common core and cavity molds, irrespective of the type of the terminal.

In addition, the electromagnetic shield having an additional bent portion is formed by pressing a plate-shaped metal material, which results in only a slight increase in cost even by addition of the bent portion. From the viewpoint of the overall manufacturing costs of the electronics housing, the electromagnetic shield structure of the electronics housing according to the present embodiment is applied to thereby allow cost reduction. Furthermore, as the electromagnetic shield is divided into a plurality of shield members, the electromagnetic shield can readily be installed so as to surround the substrate while aligning the opening of the electromagnetic shield with the position of the terminal on the substrate.

Third Embodiment

In the electromagnetic shield structure of electronics housing 1 according to the third embodiment of the present invention, the inner edge of opening 14 of third shield member 11 and an outer periphery 4 of protrusion 3 of terminal 2 are pressed against each other to cause third shield member 11 to be biased toward the front surface side of the electromagnetic shield, such that first shield member 9 and second shield member 7 are brought into close contact with third shield member 11. Since the configuration other than the above is the same as that in the first or second embodiment, the description thereof will not be repeated.

For example, in the case where outer periphery 4 of protrusion 3 of terminal 2 is formed in the tapered shape in electronics housing 1 shown in FIG. 5, the size of opening 14 in third shield member 11 is set such that when third shield member 11 is inserted up to basal portion 5 of protrusion 3, outer periphery 4 at basal portion 5 of protrusion 3 of terminal 2 and the edge of opening 14 may be pressed against each other. Specifically, when protrusion 3 of terminal 2 having a tapered shape is inserted through opening 14 in third shield member 11, protrusion 3 gradually increases in external size as it appears through the opening. Since the external size of protrusion 3 is greatest at basal portion 5 of protrusion 3, the size of opening 14 in third shield member 11 is set slightly smaller than the external size of protrusion 3 at basal portion 5.

According to the configuration as described above, third shield member 11 is inserted up to basal portion 5 of protrusion 3 of terminal 2, which causes third shield member 11 to abut against the upper and lower surfaces of protrusion 3 of terminal 2, so that third shield member 11 and protrusion 3 are pressed against each other. Accordingly, third shield member 11 attached to protrusion 3 of terminal 2 is biased toward the front surface side of the electromagnetic shield which corresponds to the tip side of protrusion 3.

The electromagnetic shield is assembled by the same method as those in the first and second embodiments such that the lower part and the upper part in the front surface of third shield member 11 are brought into contact with first shield member 9 and second shield member 7, respectively. Accordingly, third shield member 11 is biased toward the front surface side of the electromagnetic shield, so that first shield member 9 and second shield member 7 are brought into close contact with third shield member 11. This results in an improvement in conductivity of the electromagnetic shield, leading to a further effective function as an electromagnetic shield.

Furthermore, also in the case where a curved portion is formed at basal portion 5 of protrusion 3 of terminal 2, the external size of protrusion 3 is greatest at basal portion 5 thereof Accordingly, the size of opening 14 in third shield member 11 is set slightly smaller than the external size of protrusion 3 at basal portion 5. According to this configuration, third shield member 11 is inserted up to basal portion 5 of protrusion 3 of terminal 2, which causes third shield member 11 to abut against the upper and lower surfaces of protrusion 3 of terminal 2, so that third shield member 11 and protrusion 3 are pressed against each other. Accordingly, third shield member 11 attached to protrusion 3 of terminal 2 is biased toward the front surface side of the electromagnetic shield which corresponds to the tip side of protrusion 3. Also in this case, the same effects as those in the above-described case where outer periphery 4 of protrusion 3 of terminal 2 is formed in the tapered shape can be obtained.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An electromagnetic shield structure of an electronics housing, comprising:
    a terminal having a protrusion for external connection;
    a substrate having said terminal disposed thereon and electrically connected to said terminal;
    a housing made of resin, enclosing said substrate and having an opening at a position corresponding to said protrusion of said terminal on a front surface side where said protrusion of said terminal is located; and
    an electromagnetic shield disposed so as to surround said substrate inside said housing, having an opening at the position corresponding to said protrusion of said terminal, and electromagnetically shielding said substrate,
    said electromagnetic shield having a bent portion formed on said front surface side of said housing such that said bent portion fills a gap between said terminal and said housing,
    wherein the bent portion of the electromagnetic shield is located to face a circumference of the side surface of the protrusion of the terminal in a state where the protrusion of the terminal is inserted through the opening of the electromagnetic shield.

2. The electromagnetic shield structure of the electronics housing according to claim 1, wherein said bent portion formed in said electromagnetic shield is bent toward a front surface side of said housing.

3. The electromagnetic shield structure of the electronics housing according to claim 1, wherein
    said electromagnetic shield includes a first shield member disposed below said substrate, a second shield member disposed above said substrate, and a third shield member having said opening and disposed at a position of said substrate where said terminal is connected, and
    said third shield member has said bent portion formed on a peripheral region around said opening.

4. The electromagnetic shield structure of the electronics housing according to claim 1, wherein
    said electromagnetic shield includes a first shield member disposed below said substrate, a second shield member disposed above said substrate, and a third shield member having said opening and disposed at a position of said substrate where said terminal is connected, and
    said first shield member has said bent portion formed to face a lower surface of said protrusion of said terminal, said second shield member has said bent portion formed to face an upper surface of said protrusion of said terminal, and said third shield member has each said bent portion formed to face a corresponding one of side surfaces of said protrusion of said terminal.

5. The electromagnetic shield structure of the electronics housing according to claim 4, wherein an inner edge of said opening of said third shield member and an outer periphery of said protrusion of said terminal are pressed against each other to bias said third shield member toward a front surface side of said electromagnetic shield, so as to bring said first shield member and said second shield member into close contact with said third shield member.

6. The electromagnetic shield structure of the electronics housing according to claim 5, wherein said outer periphery of said protrusion of said terminal is formed in a tapered shape.

7. The electromagnetic shield structure of the electronics housing according to claim 5, wherein a curved portion is formed at a basal portion of said protrusion of said terminal.

* * * * *